United States Patent
Hahn et al.

(10) Patent No.: US 10,453,988 B2
(45) Date of Patent: Oct. 22, 2019

(54) METHODS FOR CREATING CADMIUM TELLURIDE (CDTE) AND RELATED ALLOY FILM

(71) Applicant: University of Utah Research Foundation, Salt Lake City, UT (US)

(72) Inventors: Carina Hahn, Salt Lake City, UT (US); Dennis Pruzan, Salt Lake City, UT (US); Michael Scarpulla, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 19 days.

(21) Appl. No.: 15/614,391

(22) Filed: Jun. 5, 2017

(65) Prior Publication Data

US 2017/0352775 A1 Dec. 7, 2017

Related U.S. Application Data

(60) Provisional application No. 62/446,738, filed on Jan. 16, 2017, provisional application No. 62/345,290, filed on Jun. 3, 2016.

(51) Int. Cl.
*H01L 31/18* (2006.01)

(52) U.S. Cl.
CPC ...... *H01L 31/1836* (2013.01); *H01L 31/1832* (2013.01); *Y02E 10/50* (2013.01)

(58) Field of Classification Search
CPC .............. H01L 31/1836; H01L 31/0296
See application file for complete search history.

(56) References Cited

U.S. PATENT DOCUMENTS

| 3,390,090 A | 6/1968 | Taylor et al. |
| 8,143,515 B2 | 3/2012 | Gossman et al. |
| 8,252,618 B2 | 8/2012 | O'Keefe |
| 9,147,793 B2 * | 9/2015 | Gessert ............... H01L 21/0237 |
| 2009/0078318 A1 | 3/2009 | Meyers et al. |

(Continued)

FOREIGN PATENT DOCUMENTS

| CN | 102392282 A | 3/2012 |
| WO | WO 02/091483 A2 | 11/2002 |

OTHER PUBLICATIONS

Castillo.; "Preparation of CdTe Coatings Using the Chemical Deposition Method." Journal of Organometallic Chemistry; Elsevier; Mar. 30, 2001; vol. 623, Issues 1-2; pp. 81-86.

(Continued)

*Primary Examiner* — Zandra V Smith
*Assistant Examiner* — Andre C Stevenson
(74) *Attorney, Agent, or Firm* — Thorpe North & Western, LLP

(57) ABSTRACT

A method of creating cadmium telluride films is presented. The method demonstrates heterogeneous nucleation of CdTe directly on a substrate through sequential deposition of aqueous precursor solutions containing cadmium and telluride ions, respectively. The method can include (i) applying a cadmium precursor solution to the substrate to form a cadmium precursor film on the substrate, (ii) applying a telluride precursor solution to the cadmium precursor film. The telluride precursor solution includes $Te^{2-}$ in solution such that a CdTe film is adherently formed directly on the substrate.

21 Claims, 13 Drawing Sheets

(56) References Cited

U.S. PATENT DOCUMENTS

| | | |
|---|---|---|
| 2011/0088768 A1 | 4/2011 | Gloeckler et al. |
| 2011/0139245 A1* | 6/2011 | Frey ............... H01L 31/073 136/260 |
| 2011/0284078 A1 | 11/2011 | Basol |
| 2013/0102734 A1 | 4/2013 | Takaragi et al. |
| 2013/0284979 A1* | 10/2013 | Perez Donoso ..... C09K 11/025 252/301.36 |
| 2015/0249170 A1* | 9/2015 | Snaith ............... H01L 51/422 136/256 |

OTHER PUBLICATIONS

Huang et al.; "A CdS Nanodipole Solar Cell." Progress in Photovoltaics: Research and Applications; Wiley; Mar. 2015; vol. 23, Issue 3; pp. 319-330.

Jasieniak et al.; "Solution-Processed Sintered Nanocrystal Solar Cells via Layer-by-layer Assembly." ACS Publications; Nano Letters; May 27, 2011; vol. 11, pp. 2856-2864.

Ochoa-Landin et al.; "Chemically-Deposited Te Layers Improving the Parameters of Back Contacts for CdTe Solar Cells." Solar Energy; Elsevier; Jan. 2009; vol. 83, Issue 1; pp. 134-138.

Singh et al.; "Nano-Structured CdTe, CdS and $TiO_2$ for Thin Film Solar Cell Applications." Solar Energy Materials & Solar Cells; Elsevier; May 2004; vol. 82, Issues 1-2; pp. 315-330.

Sotelo-Lerma et al.; "Perparation of CdTe Coatings Using the Chemical Deposition Method." Journal of Organometallic Chemistry; Elsevier; Mar. 30, 2001; vol. 623, Issues 1-2; pp. 81-86.

* cited by examiner

METHODS FOR CREATING CADMIUM TELLURIDE (CDTE) AND RELATED ALLOY FILM

RELATED APPLICATIONS

This application claims priority to U.S. Provisional Application No. 62/446,738 filed on Jan. 16, 2017 and U.S. Provisional Application No. 62/345,290 filed on Jun. 3, 2016, which are herein incorporated by reference.

GOVERNMENT INTEREST

This invention was made with government support under DE-EE0004946 awarded by the Department of Energy. The government has certain rights in the invention.

BACKGROUND

Cadmium telluride (CdTe) films are one of the leading commercial thin film used in photovoltaic (PV) technology with general manufacturing costs <$0.59/$W_P$ and lab efficiencies of greater than 22%. These films eclipse performance records for multi-crystalline silicon based photovoltaic cells and thin-film copper indium gallium selenide (CIGS) based thin-film photovoltaic cells. One challenge in manufacturing cadmium telluride films is the high fabrication costs and the ability to lower capital costs in order to decrease the effective price per watt of CdTe based photovoltaics. Prior manufacturing techniques include close-spaced sublimation, vapor-transport deposition, physical-vapor deposition, sputter deposition, electrodeposition, metal-organic chemical-vapor deposition, spray deposition, and screen-print deposition. However, these processes suffer from various drawbacks such as high manufacturing expense and poor film quality. For example, deposition by closed-space sublimation (CSS) is a high vacuum technique that is energy intensive and requires high processing temperatures that contribute to relatively high manufacturing costs. While manufacturing costs have been cut in half by FSLR (First Solar Inc) in recent years, achieving the Department of Energy's 2020-2030 SunShot goals of a levelized cost of electricity (LCOE) near $0.03 kWh will require an additional 50% reduction in manufacturing costs of CdTe films, as well as other costs. Since the direct material costs are dominated by module components other sources of cost reduction in photovoltaic technologies, such as reductions in manufacturing costs, are also necessary.

SUMMARY

A method for creating a cadmium telluride (CdTe) and related alloy films such as $CdTe_{1-x}S_x$ or $CdTe_{1-x}Se_x$ directly on a substrate can include heterogeneous nucleation of CdTe on the substrate through sequential deposition of an aqueous precursor solution containing cadmium ions and an aqueous precursor solution containing tellurium ions, respectively. For example, the method can include applying a cadmium precursor solution to the substrate to form a cadmium precursor film on the substrate. A telluride precursor solution can then be applied to the cadmium precursor film on the substrate. The cadmium precursor solution can include $Cd^{2+}$ ions in solution that bind to the substrate. The telluride precursor solution can include $Te^{2-}$ ions in solution such that the $Te^{2-}$ ions binds with the $Cd^{2+}$ ions forming a CdTe film adherently formed directly on the substrate. The method can optionally include a high shear wash step following each tellurium deposition. Such a high shear wash step can remove unreacted materials, remove non-adhered materials, and otherwise clean the CdTe film of debris. In another optional example, the method can include minimizing oxygen content around the substrate during deposition. In yet another optional example, the method can include drip coating a cadmium chloride, a magnesium chloride treatment, and/or a post-deposition annealing step in a reducing environment such as forming gas.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

Figure 1:
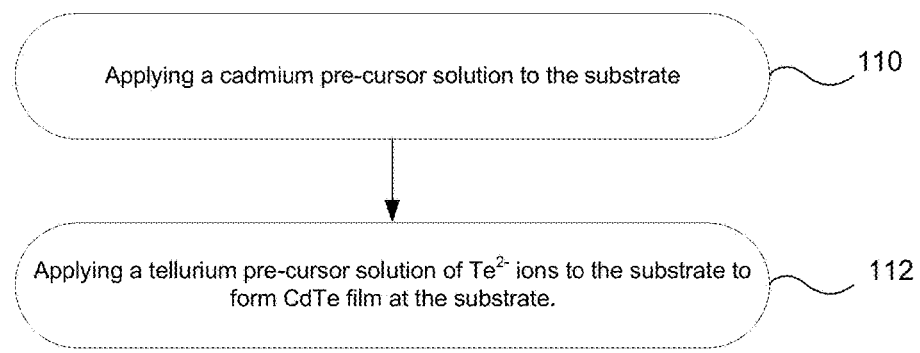
FIG. 1 graphically depicts a method for depositing cadmium telluride (CdTe) thin films on a substrate.

These figures illustrate various aspects of the invention and are not intended to be limiting of the scope in terms of dimensions, materials, configurations, arrangements, proportions, or methods unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

Definitions

In describing and claiming the present invention, the following terminology will be used.

It is noted that, as used in this specification and in the appended claims, the singular forms "a," "an," and "the" include plural referents unless the context clearly dictates otherwise. Thus, for example, reference to "a solvent" includes one or more of such solvents, and reference to "a treatment" includes reference to one or more of such steps.

As used herein, the terms "about" and "approximately" are used to provide flexibility, such as to indicate, for example, that a given value in a numerical range endpoint may be "a little above" or "a little below" the endpoint. The degree of flexibility for a particular variable can be readily determined by one skilled in the art based on the context.

Direct conversion process as used herein, refers to the formation of CdTe without creating cadmium intermediaries, such as cadmium hydroxide.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

In one example presented herein is a method of forming cadmium telluride (CdTe) films. The method can include a direct conversion process from an aqueous precursor solution containing cadmium ions and an aqueous precursor solution containing tellurium ions. In the method, the cadmium precursor solution serves as a cadmium (2+) ion source and the telluride precursor solution serves as a telluride (2−) ion source.

In one example, the method forms a cadmium telluride (CdTe) film directly on a substrate through heterogeneous nucleation of CdTe on the substrate. The method can include sequential deposition of the aqueous precursor solutions containing cadmium ions and tellurium ions, respectively. As illustrated in FIG. 1, in one example, the method can include applying a cadmium precursor solution to the substrate 110 to form a cadmium precursor film on the substrate. A telluride precursor solution can then be applied 112 to the cadmium precursor film, where the telluride precursor solution includes $Te^{2-}$ in solution such that a CdTe film is adherently formed directly on the substrate.

The substrate utilized in the method is not particularly limited. In one example, the substrate can include glass, treated glass, plastic, polymeric materials, ceramics, metal foils, or a combination thereof. In some examples the substrate can be a ceramic. Non-limiting examples of suitable ceramics can include silica, silicon nitride, silicon carbide, sapphire, zirconia, yttria, alumina, aluminum nitride, cermet, cordierite, mullite, steatite, forsterite, or a combination thereof. In another example, the substrate can be a glass substrate. In one other example the substrate can be a treated glass substrate, such as, a molybdenum coated glass substrate, a fluorine-doped tin oxide (FTO) glass substrate, a tin-dope indium oxide (ITO) glass substrate, or the like. In yet another example, the substrate can be a plastic. In a further example the substrate can be a polyimide film.

In some examples, the substrate can be processed prior to applying the cadmium and/or telluride precursor solutions. In one example, the processing can include removing organic residues from the substrate. In another example, the processing can include cleaning the substrate by ultrasonication in a mild solvent. The mild solvent can vary based on the substrate; however, non-limiting examples of suitable mild solvents can include acetone; isopropyl alcohol; isopropanol; hydrogen peroxide; 1,2,4-tricholorbenzene; 1,2-dichloroethane; 1-chlorobutane; 1-methyl-2-pyrrolidinone; 2,2,4-trimethylpentane; acetonitrile; benzene; butyl acetate; butyl alcohol; butyl ether; carbon disulfide; chlorobenzene; chloroform; cyclohexane; dimethyl sulfoxide; ether; ethyl acetate; glycerin; heptane; hexane; iso-butyl alcohol; methyl alcohol; methyl ethyl ketone; methyl formate; methyl isobutyl ketone; methyl tert-butyl ether; methylene chloride;

N,N-dimethylacetamide; n-propyl alcohol; p-dioxane; pentane; petroleum ether; pyridine; tetrachloroethylene; tetrahydrofuran; toluene; trichloroethylene; deionized water; or a combination thereof. In another example, acid or base-etching can be used to prepare the substrate.

The cadmium precursor solutions can be an aqueous solution having a cadmium source. For example, the cadmium source can be cadmium chloride, cadmium nitrate, cadmium phosphide, cadmium phosphate, cadmium sulfate, cadmium sulfide, cadmium selenide or combinations thereof, or any other source of cadmium (2+) ions. As a general rule, suitable cadmium precursors can maintain cadmium (2+) ions in solution at solution and deposition conditions. Typical solution and deposition conditions includes a substrate temperature ranging from room temperature to 200° C. and the solutions may be heated up to 90° C. In one example the cadmium source can be cadmium nitrate. In another example, the cadmium source can be cadmium chloride. In some examples the cadmium source can provide additional benefits. For example, the chlorine in cadmium chloride can act as a defect passivation agent and reduce defects in the CdTe film crystal structure during subsequent deposition and annealing stages.

The cadmium precursor solution can further include a solvent that solubilizes the cadmium source. In one example, the solvent can be water, methanol, acetonitrile, acetone, ethanol, sodium hydroxymethylsulfonate, sodium hydroxide, diethyl ether, ethyl acetate, ammonium salts and dilute acids, ammonium hydroxide, mineral acids, an oxygen free solvent, or a combination thereof, although other solvents which solubilize the cadmium source may be useful. In a specific example, the solvent can be water. In another example, the water can be deionized. In yet another example, the solvent can be methanol. In a further example, the solvent can be acetonitrile. The choice of solvent can vary based on the cadmium source. For example, cadmium chloride, cadmium sulfate, cadmium nitrate are all soluble in water; however, cadmium sulfide is insoluble in water. For example, solvents such as DMSO, toluene, chloroform, and ammonium hydroxide may be used for cadmium sulfide. Those skilled in the art are knowledgeable in choosing the proper solvent for the selected cadmium source. In some examples, the concentration of cadmium ions in the cadmium precursor solution can match the concentration of telluride ions in the telluride precursor solution. In some cases, the concentration of cadmium ions can be within 10% of the concentration of tellurium ions, and in some cases within 5%.

Turning to the telluride precursor solution, the telluride precursor solution can include a telluride source and a solvent, a reducing agent, or a combination thereof. In one example, the telluride source can be derived from a natural source of tellurium. In another example, the telluride source can be synthetic telluride. In yet another example, the telluride source can include reduced elemental telluride. For example tellurium precursors can be made by reducing elemental tellurium in a reducing agent, e.g. Rongalite (sodium hydroxymethylsulfinate) in a basic solvent such as sodium hydroxide, to generate sodium telluride (see *Preparation of CdTe coatings using the chemical deposition method*, Sotelo-Lerma et al., Journal of Organometallic Chemistry 623(1):81-86, March 2001 which is incorporated herein by reference). In another example, tellurium precursors can be made by reducing elemental tellurium in a hyphosphorous acid reducing agent in a basic solvent such as potassium hydroxide to generate potassium telluride (see Metallic Selenides and Tellurides and Process for making Same, U.S. Pat. No. 3,390,090, which is also incorporated herein by reference). In yet other examples sources of telluride ions can include ammonium telluride, zinc telluride, hydrogen telluride, or a combination thereof. Any source of telluride ions in the 2− oxidation state can be used.

The solvent, when utilized, can be any solvent that solubilizes the telluride source and does not prevent the telluride from interacting with the cadmium precursor film on the substrate. In one example the solvent can be water, methanol, acetonitrile, sodium hydroxide, potassium hydroxide, an oxygen free solvent, or any combination thereof. The reducing agent, when utilized, can be an oxygen free reducing agent, a sulfur free reducing agent, a sodium free reducing agent, or a combination thereof. For example, the reducing agent can be sodium hydroxymethylsulfonate, hypophosphorous acid, triphenylphosphine, hydrogen gas, or combinations thereof. In one example, the source of the telluride can be elemental telluride and the reducing agent can be hypophosphorous acid and potassium hydroxide.

The cadmium precursor solution and the telluride precursor solution can include the cadmium source and the telluride source, respectively, at various amounts. The quantity of the sources in the respective precursor solutions can vary based on the source and the solvent. In one example the precursor solutions can have a molarity ranging from 0.01 M to about 0.25 M. In some examples the molarity can be 0.05 M, 0.1 M, 0.15 M, or 0.20 M. In some examples the concentration of cadmium ions in the cadmium precursor solution and the concentration of telluride ions in the telluride precursor solution are chosen to match, or are at least within 10% and in some cases within 5% of one another.

In some examples the cadmium precursor solution and the telluride precursor solution can include various additives. For example, the precursor solutions can include surfactants, and/or conductivity enhances. In one example the cadmium precursor solution, the telluride precursor solution, or a combination thereof can include a surfactant. Exemplary surfactants can include sulfates, sulfonates, phosphates, carboxylates, alkyl sulfates, alkyl carboxylates, long chain alcohols, or combinations thereof. In yet other examples, the cadmium precursor solution, the telluride precursor solution, or a combination thereof can include a conductivity enhancer. Exemplary conductivity enhancers can include copper, copper nitrate, phosphorous, phosphoric acid, arsenic nitrate, nitrogen, ammonium, antimony, antimony oxide, bismuth, bismuth oxide, aluminum, aluminum oxide, indium, indium oxide, gallium, gallium oxide, cadmium chloride, or combinations thereof.

The deposition process can include depositing the cadmium precursor solution onto the substrate to form a cadmium precursor film on the substrate; followed by, depositing the tellurium precursor solution onto the cadmium precursor film on the substrate to form a cadmium tellurium film on the substrate. In one example, the cadmium precursor film on the substrate can be rinsed prior to depositing the tellurium precursor solution. In another example, the cadmium tellurium film on the substrate can be rinsed following formation. The rinse step can be used to remove loosely bonded material and undesired solvent. In some examples, the deposition of the cadmium precursor solution and the tellurium precursor solution can be repeated until the desired film thickness is achieved.

The deposition can be carried out using various methods. In one example, the deposition of each precursor solution can be accomplished using a spin coater by alternately depositing the cadmium and tellurium precursor solutions onto a substrate. In another example, the deposition of each precursor solution can be accomplished by sequential spray coating of cadmium and tellurium precursor solutions onto the substrate. In yet another example the deposition of each precursor solution can occur by alternately depositing the cadmium and tellurium precursor solutions onto a substrate. The substrate can be heated in any of these examples up to 200° C. In a further example the deposition of each precursor solution can occur by chemical solution deposition. In yet a further example the deposition can occur by a roll to roll type deposition process. In some examples, the formation of intermediate cadmium compounds (e.g. cadmium hydroxide or oxides) can be reduced or entirely avoided.

In some examples, deionized water can be applied after each cycle of applying the cadmium precursor solution and the telluride precursor solution as a rinse. In one example, the method can include a high shear wash step following each tellurium deposition. Such a high shear wash step can remove unreacted materials, remove non-adhered materials, and otherwise clean the CdTe film of debris. The high shear wash step can include spinning the CdTe film at an RPM of 500 to 6000 with a deionized water rinse, although other conditions may be suitable.

In another example, the cadmium precursor film on the substrate can be dried prior to applying the telluride precursor solution. This can be accomplished via spinning, heating, and/or leaving the film for a predetermined time to reduce solvent content in the film. Spinning or high velocity pressurized gas can result in a leveling or increased uniformity of the film. Such drying steps can optionally be applied to the CdTe film prior to subsequent cycles and/or annealing phases.

The CdTe film may be formed at room temperature or within about 15° C. to about 30° C. However, in some examples, the telluride precursor solution can be heated during deposition. In one example, the telluride precursor solution can be heated up to the boiling point of the solvent or reducer in the telluride precursor solution. For example the telluride precursor solution can be heated to a temperature ranging from about 50° C. to about 100° C. In one example, the telluride precursor solution can be heated above 50° C. In yet another example, the telluride precursor solution can be heated to a temperature ranging from about 70° C. to about 90° C. In a further example, the telluride precursor solution can be heated to about 80° C. Similarly, pressure can generally be maintained at atmospheric. However, pressures from about 0.5 atm to about 1.5 atm may be used.

In some examples the deposition can occur in ambient conditions. In other examples the deposition can occur in an oxygen free environment. Utilizing an oxygen free environment during the deposition process can prevent or reduce the formation of oxygen containing compounds such as cadmium hydroxide, cadmium oxide, or a combination thereof.

Each sequence of the deposition of the precursor solutions can generally result in a deposited thickness from about 10 nm to about 1 µm. In one example, the deposited thickness can range from about 50 nm to 500 nm, although spray deposition may allow thicker deposited films per cycle Final films can range from 10 nm to 10 µm depending on the desired application. Although deposited thickness can vary, excessively thin deposited film in each sequence can result in very long process times, while thicker deposited films may result in a greater degree of defects in the produced film. Regardless of the methodology and thickness of each layer, the deposition of precursor solutions can be repeated until the desired thickness of the cadmium telluride film is reached. The application of the cadmium precursor solution and the telluride precursor solution can be applied in an alternating format for until the desired thickness is reached. In one example, the deposition can involve from 25-50 cycles. In other examples, the deposition process can include from 10 to 100 cycles, from 15 to 75 cycles, from 30 to 60 cycles, or from 50 to 100 cycles. There is no theoretical limit to the overall thickness of the final CdTe film as long as defects are minimized at each deposition cycle. Defects can be minimized and/or passivated with optimized annealing and post-deposition treatment (e.g. $CdCl_2$).

In one example, the deposition process can be followed by a treatment process with $CdCl_2$, $MgCl_2$, $NH_4Cl$, $ZnCl_2$, HCl or a combination thereof to improve the crystalline and optoelectronic quality of the CdTe film. Optoelectronic quality will be determined by photoluminescence (PL) measurements. PL should yield a signal comparable with vapor deposited layers of the same composition. In one example, the treatment can include drip coating a solution containing cadmium chloride, magnesium chloride, ammonium chloride, zinc chloride, hydrochloric acid, or a combination thereof onto the film. In one example the drip coating solution can be methanol and cadmium chloride.

In yet another example the deposition process can be followed by thermal annealing. The annealing can occur once the predetermined thickness is reached after multiple deposition cycles, or between one or more deposition cycles. In some examples the CdTe film can be subject to multiple thermal annealing. For example, the film can be thermally annealed, additional deposition cycles can occur, and then the CdTe film can be thermally annealed again.

The annealing process can include heating the CdTe film to a temperature above the recrystallization temperature of the film. For example, the heating can generally be conducted at a temperature ranging from about 300° C. to about 600° C. In other examples thermal annealing can be conducted at a temperature ranging from about 350° C. to about 450° C., from about 325° C. to about 375° C., from about 350° C. to about 400° C., from about 350° C. to 550° C., or from about 300° C. to about 500° C.

The time period for the annealing can also vary. For example, the thermal annealing can occur at a time period ranging from about 1 min to about 2 hours. In yet other examples, the time period can range from about 15 minutes to 60 minutes, from about 30 minutes to about 45 minutes, from about 40 minutes to about 80 minutes, or from about 60 minutes to about 2 hours. The time period for the thermal annealing can vary based on the temperature. For example the thermal annealing can occur at temperatures ranging from about 350° C. to about 550° C. from about 1 minute to 60 minute. In another example, the thermal annealing can be at about 400° C. for about 30 minutes.

In some examples the thermal annealing can be performed under a reducing atmosphere. The reducing atmosphere can be used to react and remove undesired elements, such as sulfur, that may form volatiles during annealing. The reducing atmosphere may be formed using combinations of hydrogen gas with nitrogen gas, argon gas, helium gas, or combinations thereof. In one example, the thermal annealing can occur in a forming gas (4-5% $H_2$ in $N_2$) environment. In another example, the thermal annealing can occur in an oxygen free environment. In yet another example, the thermal annealing can occur in the presence of tellurium powder. In a further example, the thermal annealing can occur in an oxygen-free quartz tube furnace at 400° C. for 30 minutes in the presence of a tellurium powder. In one optional example, the method can include minimizing the oxygen content around the substrate. Minimizing the oxygen content refers to a reduction in atmospheric oxygen (e.g. about 21% oxygen at STP) by at least 50% or more. In another example, the atmospheric oxygen content can be about 5% or less around the substrate. In one example, minimizing the oxygen content around the substrate can include flowing nitrogen gas into a deposition space around the substrate. Alternatively, the oxygen content can be reduced by maintaining a reducing atmosphere. One example reducing atmosphere is a 4% hydrogen in nitrogen atmosphere.

The method described herein can have a reduced cost when compared to methods previously utilized to create cadmium telluride films. In one example, the method does not require electrodeposition. Furthermore, this approach can avoid the use of stabilizing ligands in solution which can contaminate the final CdTe film. In another example, the method can exclude the formation of hazardous intermediates, such as cadmium hydroxide. In one example, a cadmium hydroxide intermediary is not formed. The ability to exclude the formation of hazardous intermediaries can prevent health issues associated with exposure to those intermediaries and handling and disposal expenses associated with the hazardous intermediary.

The resultant film can have various properties. In one example, the resultant cadmium telluride film can be a crystalline film. The crystalline structure can have visible grains that range from 100 nm to 200 nm in size. In other examples, the cadmium telluride film can have grain sizes ranging from about 50 nm to 150 nm on average. In one example, the grain size can be on average around 100 nm. In another example, the resultant film can have powder x-ray diffraction (XRD) patterns that show high crystallinity and preferential texturing of the grains. In one example, the resultant film can have high packing fractions, grains up to 4 μm in diameter, and photoluminescence data of a prominent peak at ~1.35 eV, indicative of a donor-acceptor transition.

In many cases, the CdTe film can be substantially stoichiometric Cd—Te composition where substitutions of the regular Cd—Te crystal lattice are less than 0.5% of the lattice structure, and in some cases less than 0.1%. As a general rule the film can have a composition of $CdTe_{1-x}S_x$ or $CdTe_{1-x}Se_x$ where x is from 0 to 1. In cases where x=0 then the film is an unsubstituted CdTe film. In cases where x is greater than 0 but less than 1, then an alloy is formed.

For example, the resultant film can also be a cadmium telluride/cadmium sulfur alloy. The alloy can have a $CdTe_{1-x}S_x$ layer (where 0<x<1). These films, in one example, can incorporate less than 10% sulfur. Generally, the sulfur is a one-to-one substitution for tellurium in the crystal lattice. In other examples these films can include about 1%, about 2%, about 3%, about 4%, about 5%, about 6%, about 7%, about 8%, or about 9% sulfur. The sulfur containing CdTe films can occur when the telluride precursor solution incorporates sulfur in a sufficient amount to form a cadmium telluride sulfur alloy. For example, the use of sodium hydroxymethylsulfinate as the reducing agent can result in sulfur incorporation. In some cases, all film layers can include sulfur, while in other embodiments one or more layers include sulfur while other layers or portions of the film are sulfur free. In such cases, the sulfur can be added only during desired layer formation steps. Photovoltaics which include sulfur can also be used as nano-dipole photovoltaic devices. In such cases, a CdTeS film is oriented between two conducting layers or electrodes (e.g. ITO or other conductive material).

Similarly, cadmium telluride selenium alloys can also be formed by including a selenium source during formation. For example, $CdTe_{1-x}Se_x$ layers (where 0<x<1) can be formed by including a selenium source (e.g. cadmium selenide) during application of the cadmium precursor solution.

The resultant CdTe film can be used in a variety of technologies. In one example, the film can be used in semiconductors and/or photovoltaic devices, such as solar panels. In another example the CdTe film can act as an active absorbing layer.

EXAMPLES

Example 1—0.5 M Cadmium Nitrate Source

A cadmium telluride film was created on a molybdenum-coated glass substrate or a fluorine-doped indium oxide coated glass substrate. The substrate was sonicated for 30 minutes in a 1% Alconox or liquinox solution and rinsed in de-ionized (DI) water for 5 minutes. The cadmium precursor solution was prepared by creating an aqueous mixture of 0.05 M cadmium nitrate ($Cd(NO_3)_2$) in deionized water. The telluride solution was created following the method outlined by M. Sotelo-Lerma, R. A. Zingaro, and S. J. Castillo, "Preparation of CdTe coatings using the chemical deposition method," Journal of Organometallic Chemistry, 623, 81-86, 2001 (which is incorporated herein by reference) and includes reducing elemental telluride powder in a mixture of Rongalite (sodium hydroxymethylsulfinate), sodium hydroxide (NaOH), and water. Both the precursor solutions were taken to reflux under an inert environment until they completely lost color (almost clear solution). The precursor solutions were then capped with a rubber stopper to maintain an inert environment inside the flask.

Figure 2:
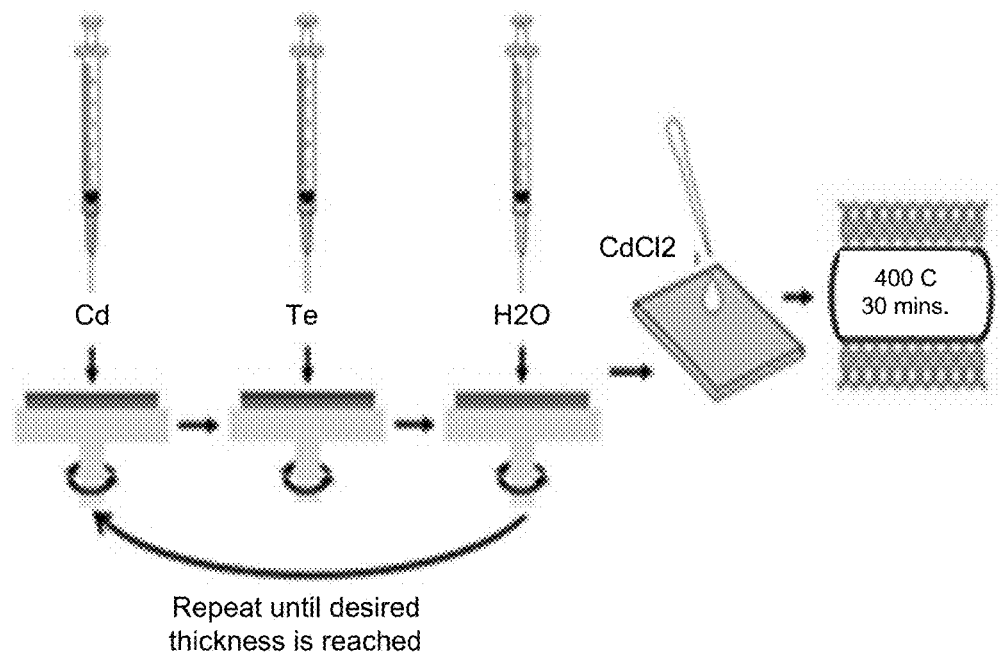
FIG. 2 schematically presents a method for depositing cadmium telluride thin films on a substrate.

A spin coater was used to deposit the cadmium precursor solution and the telluride precursor solution to the substrate. A needle nose syringe was used to extract the precursor solutions out of the flasks. The telluride solution was kept heated at 80° C. to prevent precipitation of $Na_2Te$ within the flask. The substrate was placed on the spin coater and a plastic covering was placed over the top of the spin coater. A hole was cut in the plastic covering to allow for solutions to be dropped onto the substrate. Nitrogen gas was lightly blown into the deposition space to purge the spin coater of oxygen around the substrate. The deposition of the cadmium telluride (CdTe) layer involved 25-50 cycles of individually depositing/spinning ~1 ml of the precursor solutions followed by 2 ml of deionized water as a rinse step. Between solutions the substrate was spun for 25 seconds with a maximum of 4,000 rotations per minute. FIG. 2 schematically displays this application method of depositing a cadmium precursor solution, depositing the tellurium solution, rinsing with water, and then repeating. Following the staged film deposition stage, a cadmium chloride solution is added. This example illustrates a spin coating process, although a similar process can be used with spray deposition in the same manner.

Following the formation of the CdTe film the film was further processed. In one example, the film was annealed in a tube furnace at 400° C. for 30 minutes in a forming gas atmosphere (4% $H_2$ in $N_2$). The film was then treated with an aqueous cadmium chloride ($CdCl_2$) deposition. A saturated solution of CdTe in methanol was drip coated onto the CdTe film. The samples were left to dry and then annealed again at 400° C. for 30 minutes.

Example 2—0.5 M Cadmium Chloride Source

A cadmium telluride film was created using the methodology described in Example 1; however, the cadmium source was a 0.5 M cadmium chloride ($CdCl_2$) in the cadmium precursor solution.

Figure 3:
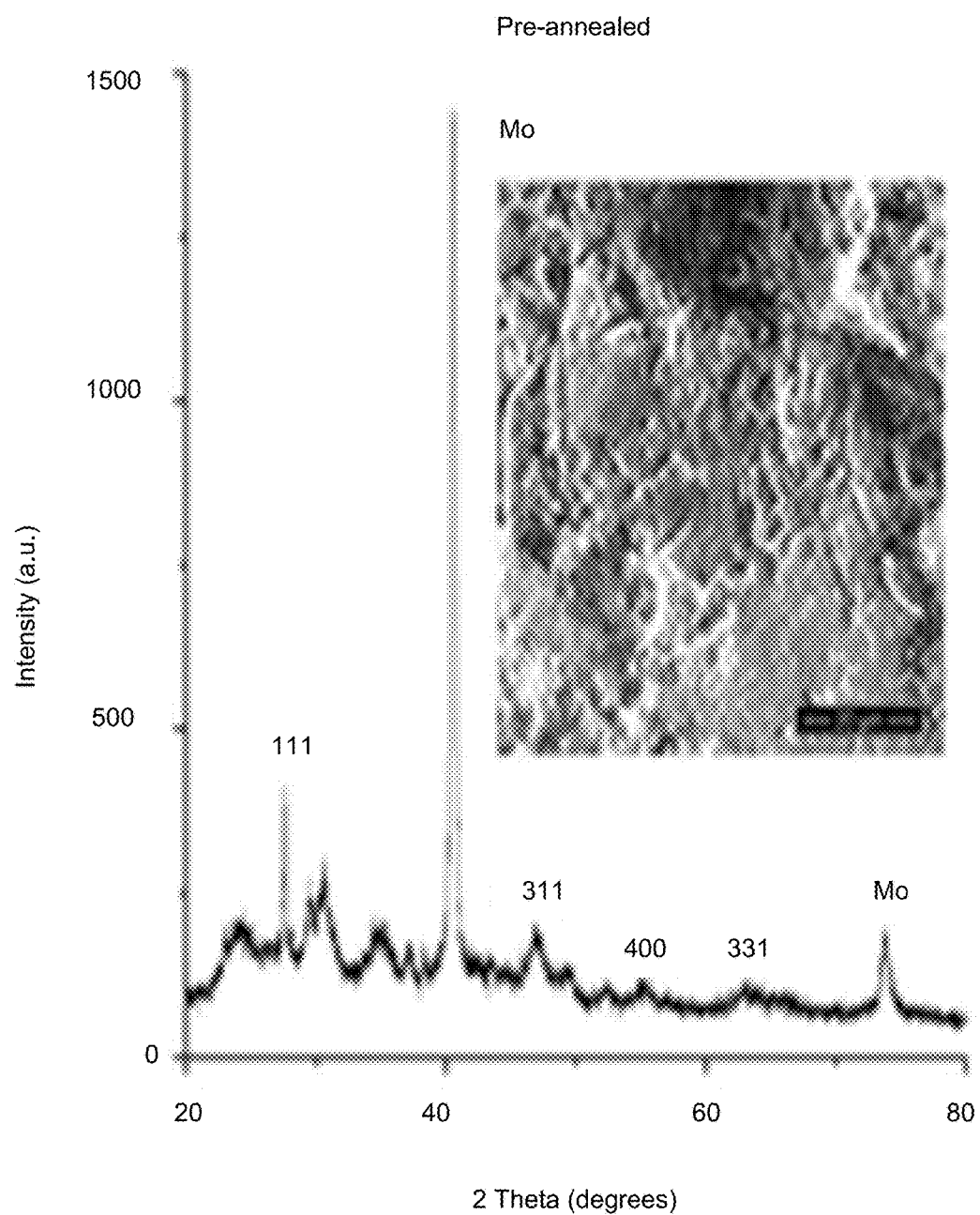
FIG. 3 graphically displays XRD results and a SEM image for a CdTe film created in accordance with one example, presented herein.

The resultant film was analyzed using XRD and SEM. The film exhibited both weak XRD peaks and a mixture of phases as shown in FIG. 3. The strongest peaks occurred at $2\theta=41°$ and $2\theta=74°$ due to the molybdenum substrate. The remaining peaks were a mixture of the desired CdTe phase with numerous undesired phases. Although it is difficult to conclusively identify the other peaks, they are believed to be primarily due to oxygen-containing compounds including cadmium hydroxide ($Cd(OH)_2$) and cadmium oxide (CdO) that form readily given the deposition conditions in ambient atmosphere as well as sulfur-based complexes formed due to the Rongalite reducing agent. The poor initial film quality can be readily seen in the corresponding SEM image, also shown in FIG. 3, where the film appears very non-uniform with large microstructures on the surface of the underlying film. As-deposited EDS profiles indicate a Cd-rich stoichiometry (~60:40 at % ratio), which is in agreement with the presence of cadmium compounds in the absence of tellurium. When films were annealed in the presence of oxygen, XRD peak intensities remained weak and numerous additional peaks formed including CdO as well as other unidentifiable peaks that were oxygen related as they are not present in films annealed without oxygen.

Figure 4:
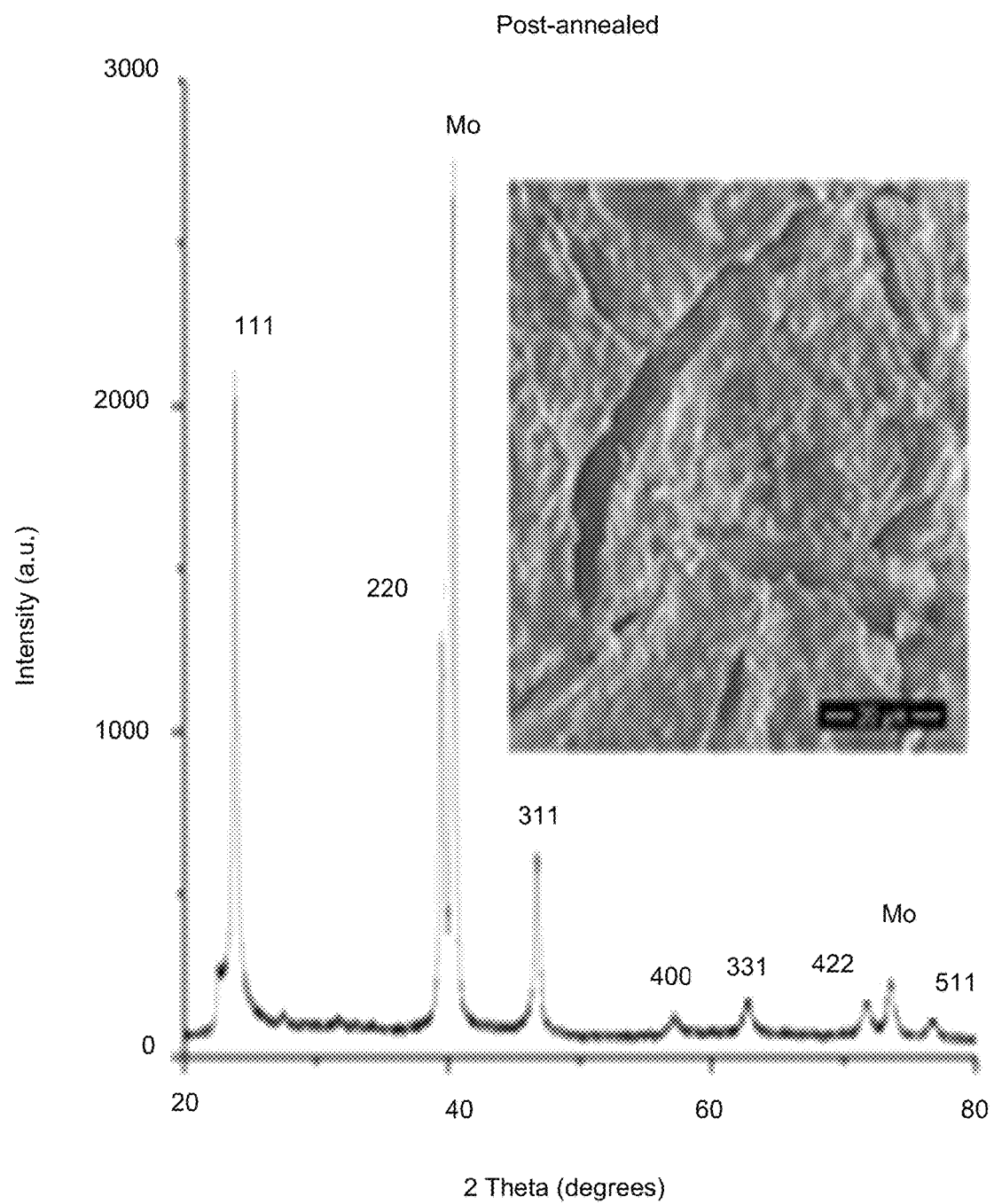
FIG. 4 graphically displays XRD results and a SEM image for a CdTe film created in accordance with one example, presented herein.

The XRD profile in FIG. 4 displays the film following the first annealing at 400° C. for 30 minutes, which shows nearly all of the peaks that were not associated with CdTe or Mo disappeared and a significant increase in the intensity of the CdTe peaks. The separation of the peak around $2\theta=40°$ is further evidence of crystallization within the films as this separation in the peak was not visible prior to annealing. EDS results indicated slightly Te-rich (~52:48 at %) stoichiometry following the annealing step, although this is within the expected uncertainty of EDS for stoichiometric CdTe. It is unclear whether the shift in stoichiometry was driven by the incorporation of Te into the matrix or from the evaporation of unstable cadmium phases, although it was likely some combination of the two processes occurred. The SEM of the thermally annealed film, seen in FIG. 4, shows a more uniform film than the as-deposited, but exhibits large cracks that could be a result of stresses induced by evaporation during the annealing stage.

Figure 5:
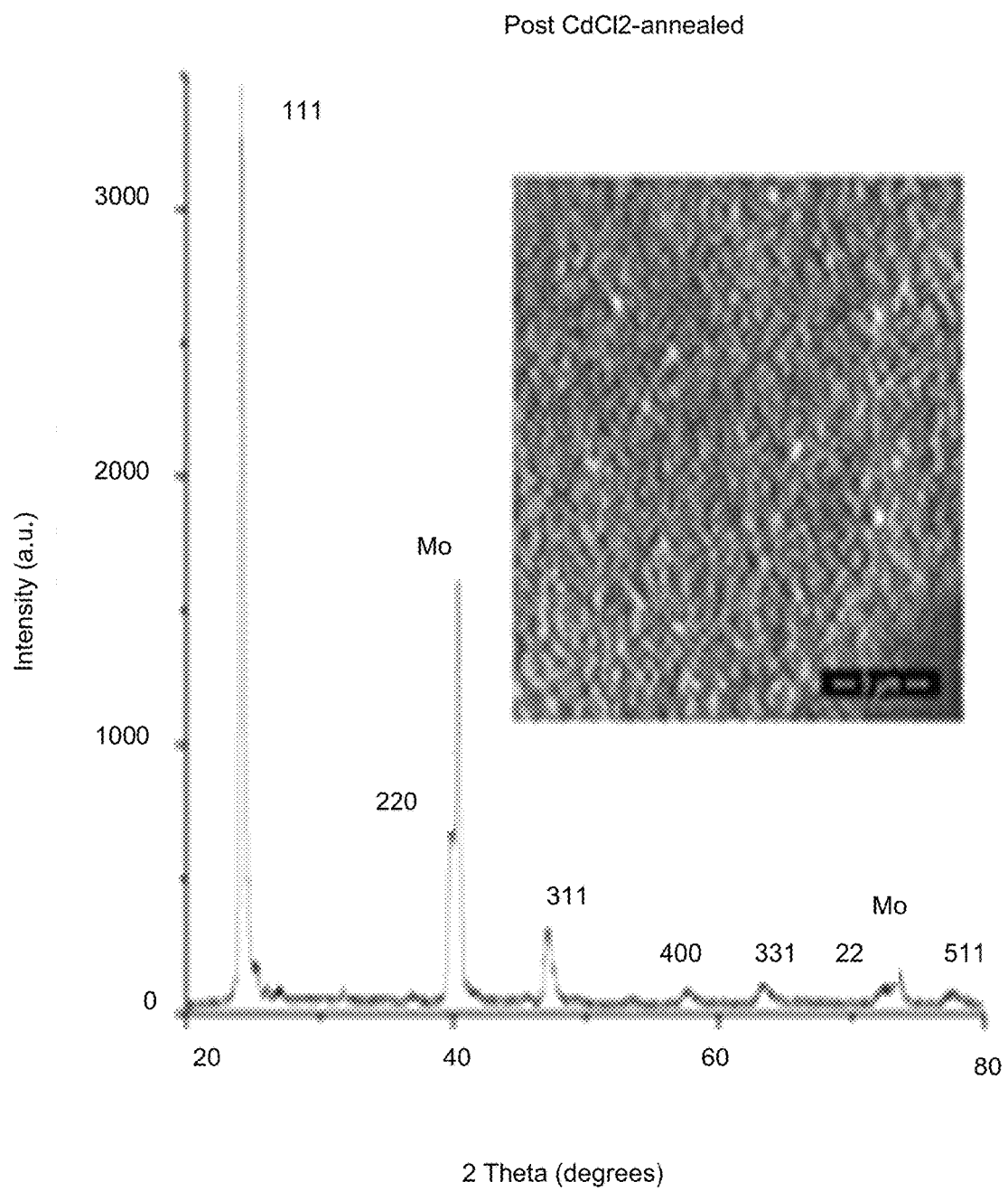
FIG. 5 graphically displays XRD results and a SEM image for a CdTe film created in accordance with one example, presented herein.

The XRD profile in FIG. 5 shows the final state of the film following a $CdCl_2$ treatment at 400° C. for another 30 minutes. There is clear enrichment of the (111) peak of CdTe, which implies that the $CdCl_2$ treatment induces recrystallization of the grains with a preferred orientation. The reduction in intensity of the Mo substrate peak from FIG. 4 to FIG. 5 appears to be due to a higher packing fraction within the film following the $CdCl_2$ treatment, a likely indication of grain growth within the CdTe layer. SEM images of the final films, shown in FIG. 5, show uniform films with visible grains ranging from about 100 to 200 nm in size.

Example 3—0.04 M Cadmium Chloride

A fluorine doped tin oxide (FTO) glass substrate was sonicated for 10 minutes in acetone, then 10 minutes in isopropanol, and then 10 minutes in deionized (DI) water to remove organic residues. The cleaned substrate was then stored in DI water to prevent subsequent contamination. A cadmium precursor solution was created as an aqueous mixture of ~0.04 M cadmium chloride ($CdCl_2$). A telluride precursor solution was also prepared as outlined in Example 1. More specifically the telluride precursor solution was reduced elemental telluride powder in a mixture of Rongalite (sodium hydroxymethylsulfinate), sodium hydroxide (NaOH), and water. The solution was taken to reflux under an inert environment until it became a nearly colorless solution and was subsequently capped with a rubber stopper to maintain an inert environment inside the flask and prevent rapid oxidation of the telluride species (nominally in its 2-oxidation state) back to elemental Te.

The telluride solution began to precipitate long white crystals, believed to be $Na_2Te$, within the flask at temperatures below ~50° C. During the deposition, the Te solution was heated to ~80° C.-90° C. A needle nose syringe was used to extract both the Cd and Te solutions from the flasks. The substrate was placed onto a spin coater and nitrogen gas was gently blown into the deposition space to minimize the oxygen content around the substrate. The formation of the CdTe layer involved cycles of statically depositing and subsequently spinning each of the precursor solutions (Cd solution first, then Te solution) followed by a rinse step with DI water. The solutions were each spun for ~20-30 seconds with a maximum of 4000 rotations per minute. This cycle was repeated until the desired thickness was reached.

A saturated solution of $CdCl_2$ in methanol was drip coated onto some of the CdTe films followed by a drying step in ambient conditions. Thermal annealing of the samples was carried out in a tube furnace at 400° C. for 30 minutes in a forming gas atmosphere (4% $H_2$ in $N_2$) with and without the cadmium chloride ($CdCl_2$) layer. A process flow diagram representing this process is shown in FIG. 2. X-ray diffraction (XRD) and scanning electron microscope (SEM) were used to characterize the film at each step in the process.

Figure 6:
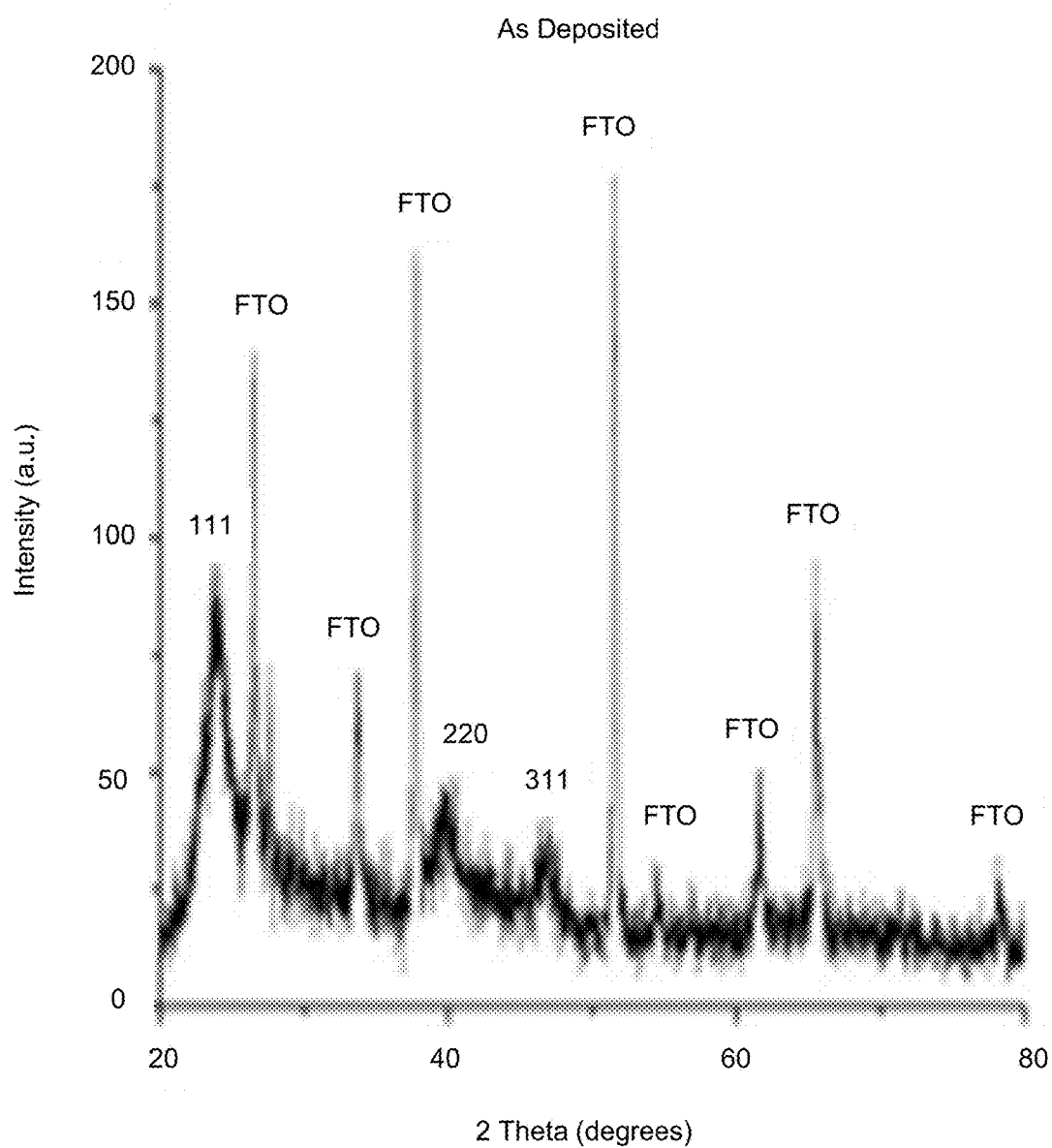
FIG. 6 graphically displays XRD results for a CdTe film created in accordance with one example, presented herein.
Figure 10:
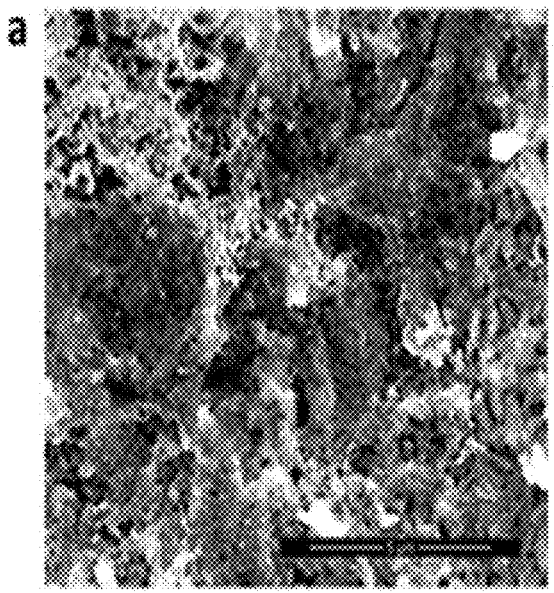
FIG. 10 is a SEM image for a CdTe film created in accordance with one example, presented herein.

The evolution of the films was measured by XRD and SEM from the initial deposition following the different post-deposition annealing treatments. See FIGS. 6-13. The as-deposited films, shown in FIG. 6 (XRD) and FIG. 10 (SEM), exhibited weak XRD signals as well as a mixture of phases. Although the majority of the peaks were attributable to CdTe or the FTO substrate, there were numerous other peaks that are more difficult to assign due to the complexities of the solution chemistry of the process, although they are believed to be sulfur related compounds. SEM images of the as-deposited sample show a rough film texture without visible grains. FIG. 10. Following a basic thermal annealing treatment in a forming gas environment, the CdTe films began to show good crystallinity. The forming gas was chosen to provide a reducing environment within the annealing chamber and thus maximize any conversion reactions taking place within the films from secondary phases to the desired CdTe phase, as well as, to prevent any oxidation reactions. As-deposited films that were annealed in air showed evidence of preferential $CdSO_x$ ($x \geq 2$) formation that supports the presence of CdS and $CdSO_2$ in the as-deposited films that were further oxidized when exposed to oxygen at elevated temperatures.

Figure 7:
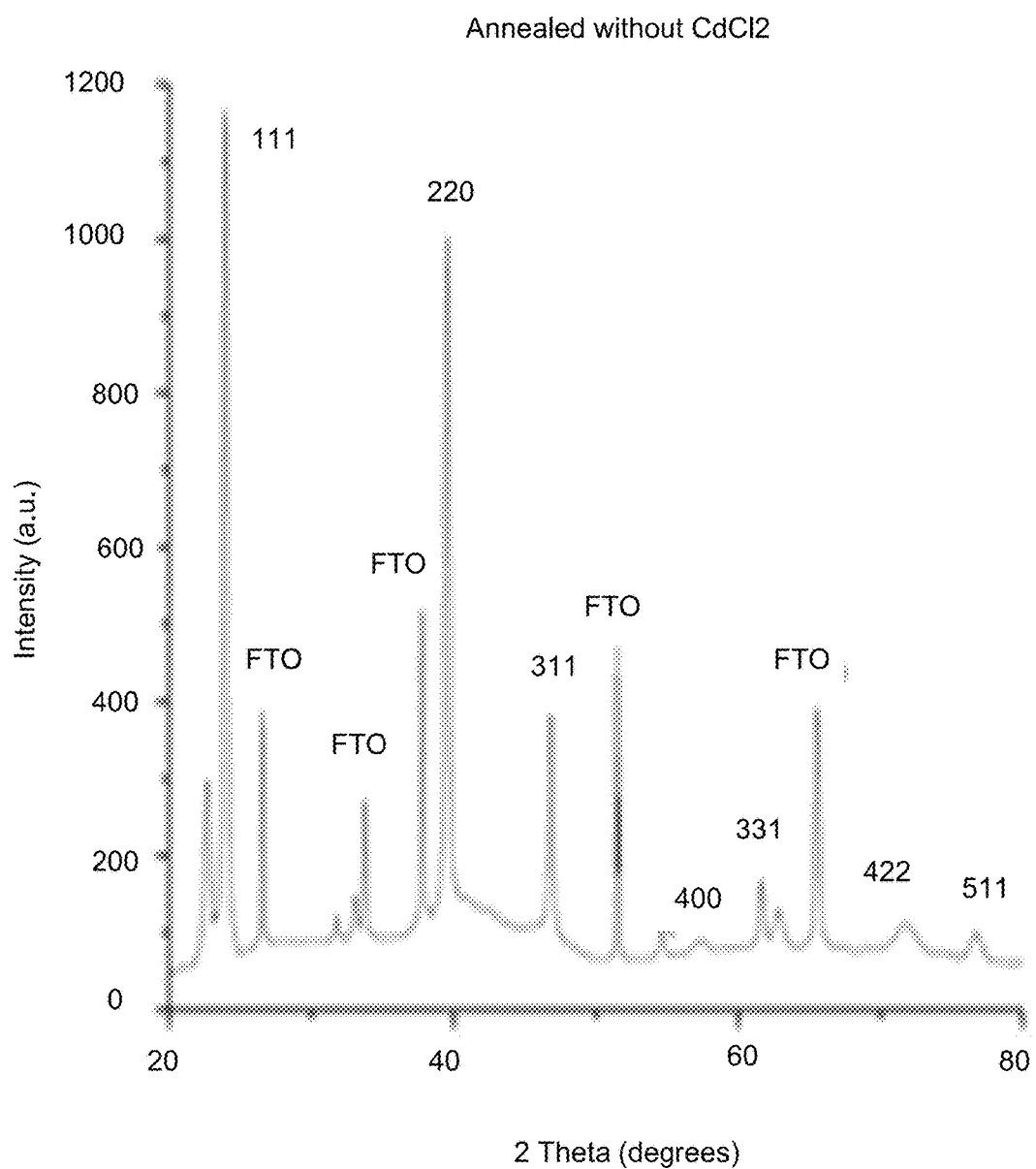
FIG. 7 graphically displays XRD results for a CdTe film created in accordance with one example, presented herein.
Figure 8:
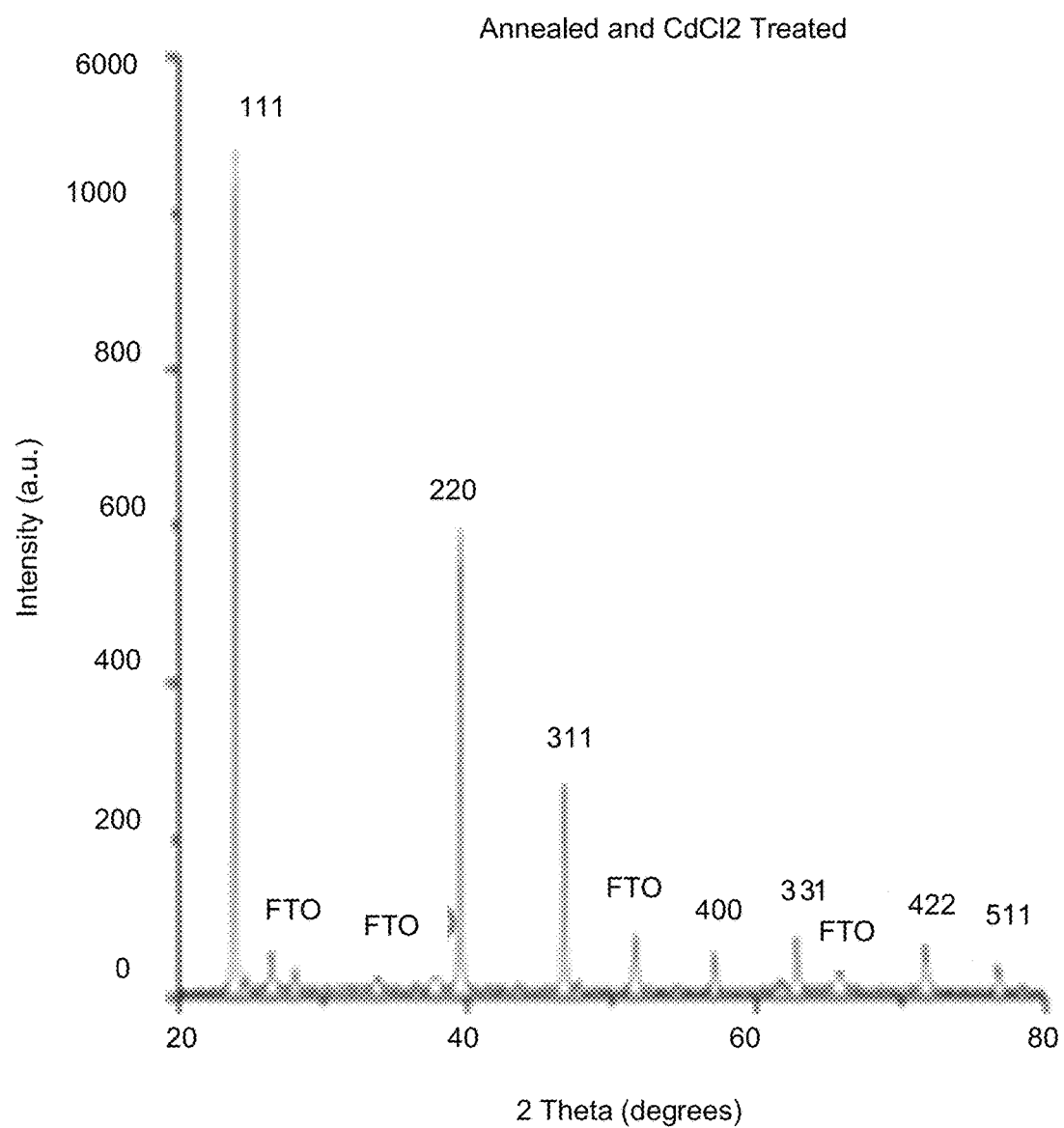
FIG. 8 graphically displays XRD results for a CdTe film created in accordance with one example, presented herein.
Figure 9:
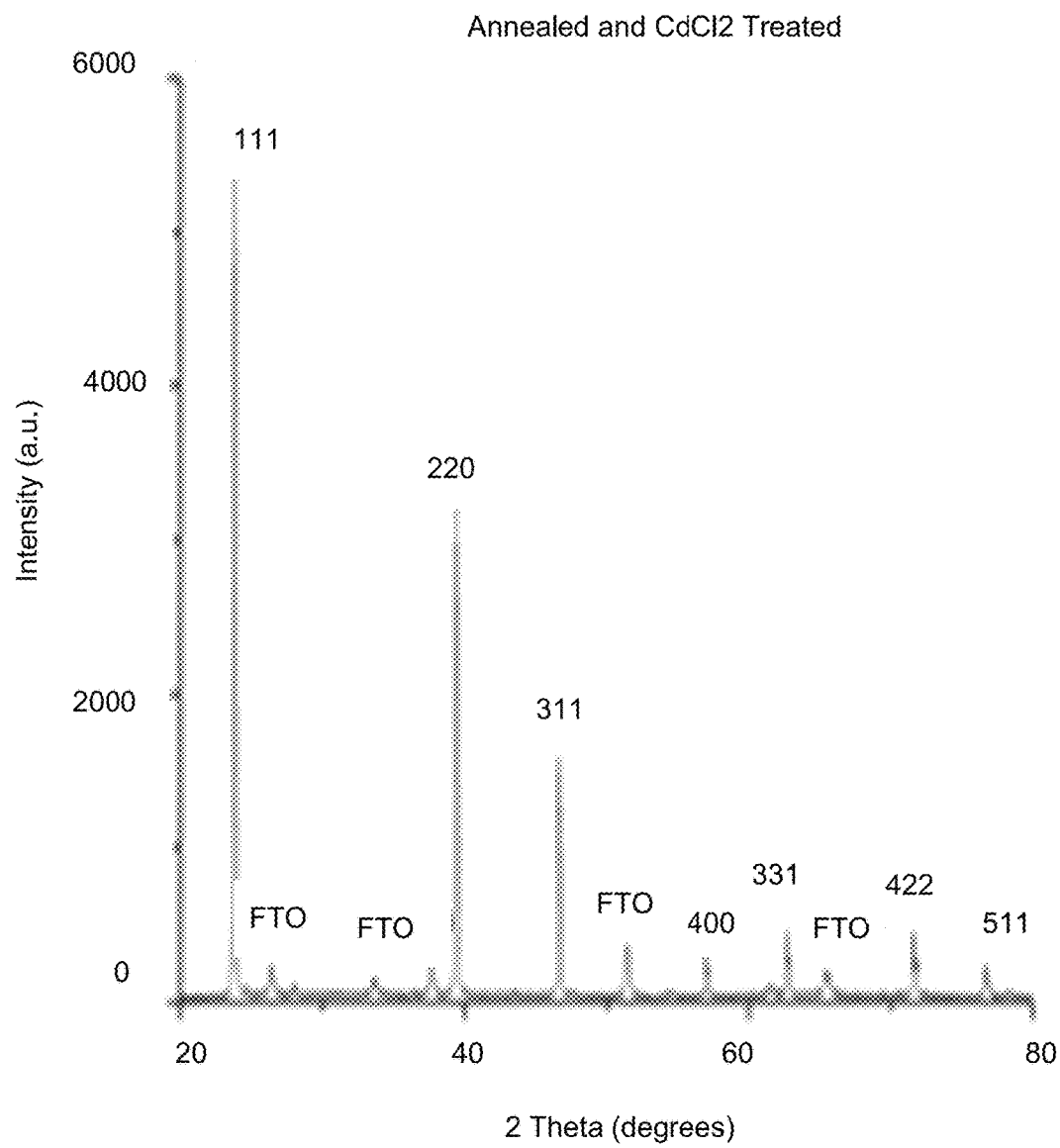
FIG. 9 graphically displays XRD results for a CdTe film created in accordance with one example, presented herein.
Figure 11:
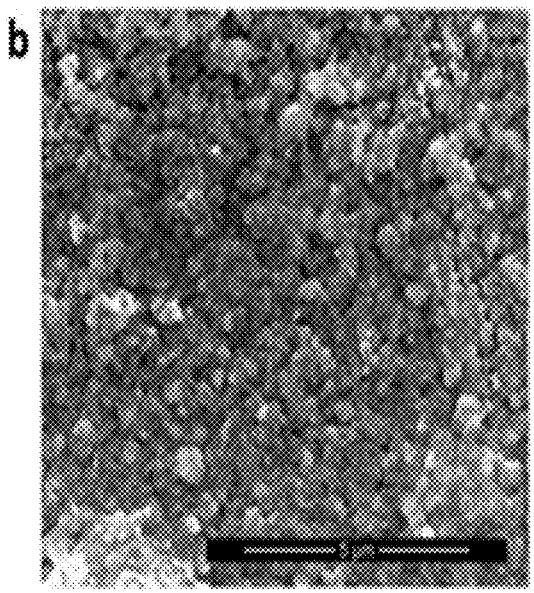
FIG. 11 is a SEM image for a CdTe film created in accordance with one example, presented herein.

The x-ray diffraction (XRD) patterns of the formation of CdTe film indicate the preferential to the formation of sulfur compounds. Following the thermal annealing treatment FIG. 7 shows the XRD signal strength increased by a factor of 5 or more and a corresponding increase in CdTe signal relative to all the other peaks. The SEM image of the thermal annealed film in FIG. 11 shows grain sizes of 100-200 nm with much better uniformity and packing fraction relative to the as-deposited film FIG. 10.

Figure 12:
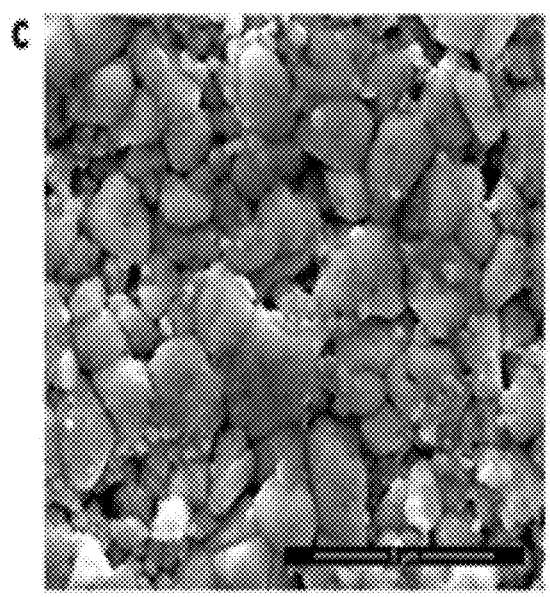
FIG. 12 is a SEM image for a CdTe film created in accordance with one example, presented herein.
Figure 13:
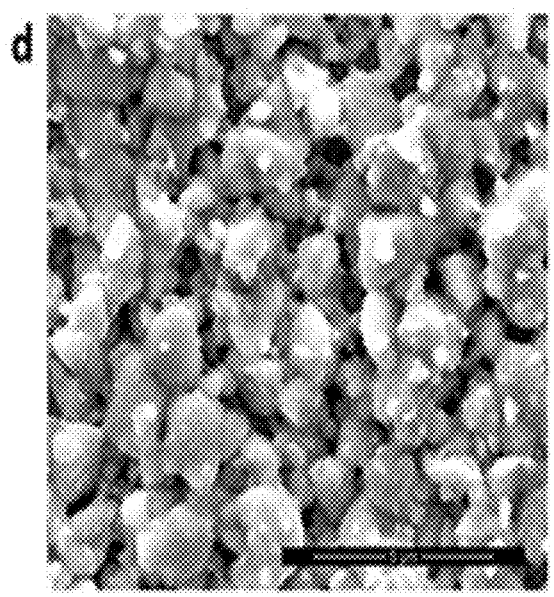
FIG. 13 is a SEM image for a CdTe film created in accordance with one example presented herein.

The greatest transformation was visible when the films were treated with $CdCl_2$, regardless of their previous annealing history. The XRD profiles in FIG. 8 and FIG. 9 were nearly identical for the sample subjected to Cl activation following a 30 minute anneal in forming gas versus those subjected to Cl activation immediately following the deposition. The SEM images in FIG. 12 and FIG. 13 showed similar film morphologies with grain sizes up to 2 μm, but both films show large voids scattered between the grains. Without being limited to theory, it is thought that the voids could be related to both the initial thickness of the films and the concentrations of the Cd and Te precursor solutions. The films were only deposited to ~1 μm as the experiments were focused on optimizing the as-deposited film uniformity. However, the precursor solution concentrations affected initial film densities which very likely affected the post-annealing film morphology.

Figure 14:
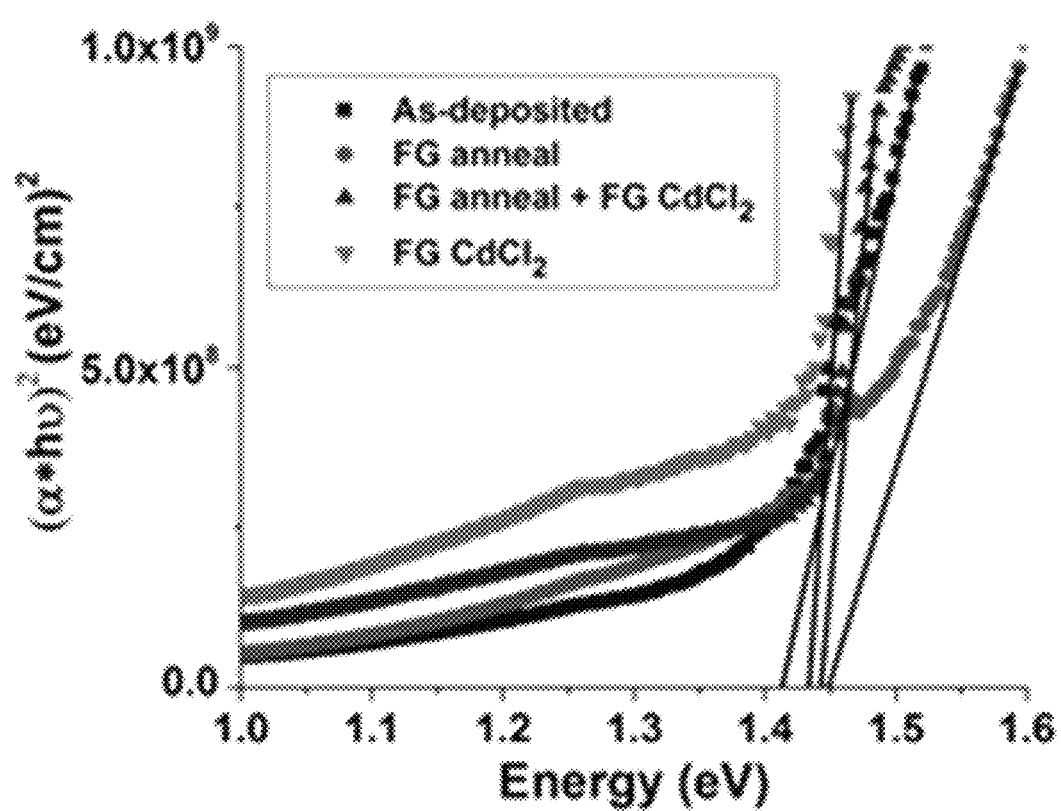
FIG. 14 graphically displays bandgap energy results for several CdTe films created in accordance with one example presented herein.

The films were also analyzed for band gap energy, as shown in FIG. 14. Transmission measurements were taken on the four samples and confirmed the band gap of the material to be near the 1.45 eV (slightly smaller than the accepted bandgap for CdTe at room temperature). There seemed to be a slight decrease in the effective bandgap of the material for the chlorine treated samples, which may be explained by light sulfur alloying within the films.

Figure 15:
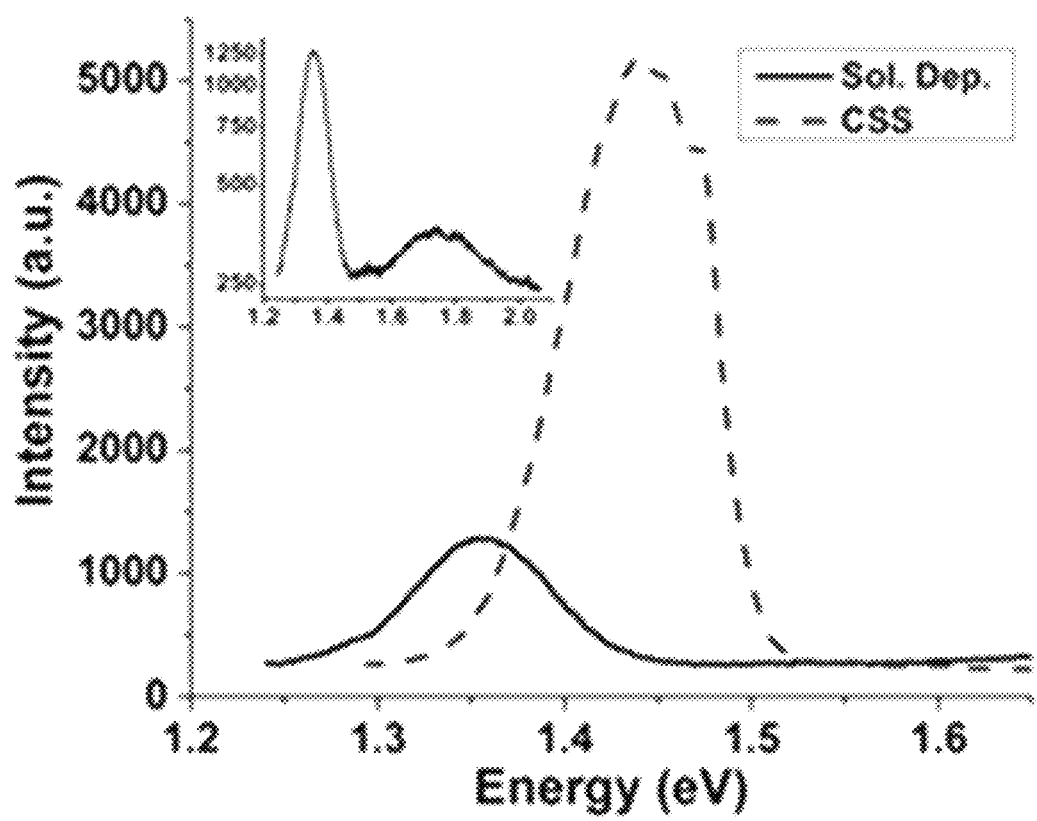
FIG. 15 graphically displays intensity vs. energy for several CdTe films created in accordance with one example presented herein.

The films subjected to chlorine treatment (FIGS. 8, 9, and 12, 13) were further analyzed. These films exhibited PL active with a prominent 1.35 eV peak. See FIG. 15. Since the samples were only PL active after chlorine treatment the radiative efficiency of the samples were greatly improved following chlorine activation. It is unclear whether the dominant donor acceptor pair seen in PL measurements was formed during the Cl activation step or simply that other non-radiative recombination sites were being passivated during that step. There was no excitonic peak observed in the spectra apparently due to incomplete absorption owing to low film thickness.

Following the chlorine activation step, films of ~1 μm thickness showed nearly phase pure CdTe with preferential (111) orientation and grain sizes up to 4 μm in diameter. The films exhibited a PL peak at 1.35 eV, indicative of a dominant donor-acceptor pair. UV-Vis characterization confirmed the band gap of the material to be near the accepted 1.5 eV value of CdTe. These methods can provide a route to deposit CdTe without using high vacuum methods.

Figure 16A:
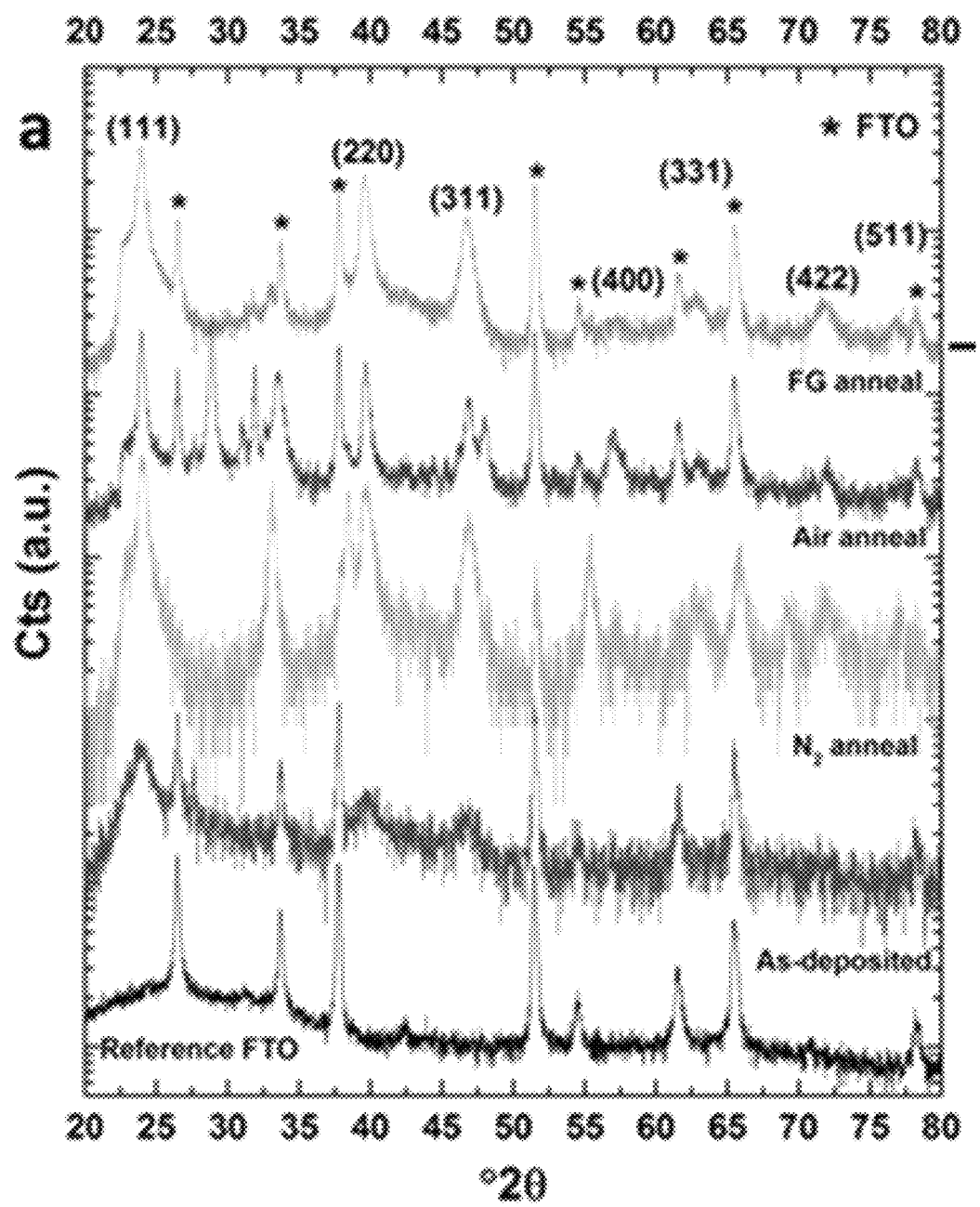
FIG. 16A is a graph of XRD results for several CdTe films having various annealing conditions in accordance with one example presented herein.
Figure 16B:
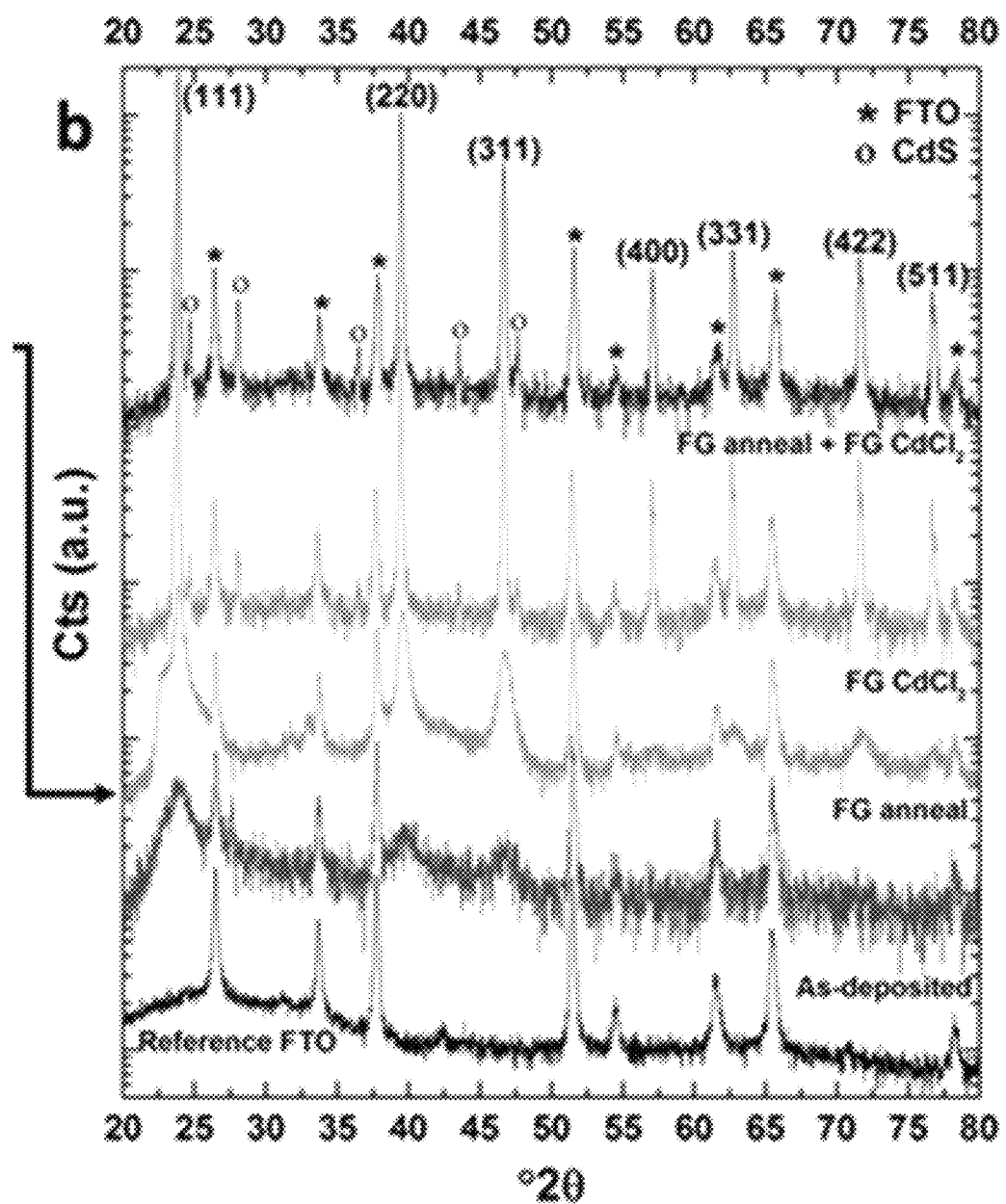
FIG. 16B is a graph of XRD results for several CdTe film having various annealing conditions in accordance with one example presented herein.

FIG. 16A shows XRD profiles from the reference FTO (black), as-deposited film (red) and annealed in 3 different atmospheres: $N_2$ (cyan), air (violet), and forming gas (FG) (green). FIG. 16B shows XRD results from films in the following states: Reference FTO (black), as-deposited (red), FG anneal (green), direct 1-step $CdCl_2$ treatment in FG (orange), and FG anneal+$CdCl_2$ treatment in FG (blue). The two XRD profiles are plotted on a logarithmic scale to accentuate the presence of smaller peaks and displaced vertically for clarity. The arrow shows that the two green profiles are identical as a common reference point.

The foregoing detailed description describes the invention with reference to specific exemplary embodiments. However, it will be appreciated that various modifications and changes can be made without departing from the scope of the present invention as set forth in the appended claims. The detailed description, examples, and accompanying drawings are to be regarded as merely illustrative, rather than as restrictive. It is therefore intended that the invention be limited only by the scope of the appended claims.

What is claimed is:

1. A method for creating cadmium telluride (CdTe) film, comprising:
    applying one of a cadmium precursor solution or a telluride precursor solution to a substrate to form a precursor film on the substrate; and
    applying the other of the cadmium precursor solution or the telluride precursor solution to the precursor film, wherein the telluride precursor solution includes $Te^{2-}$ in solution such that a CdTe film is adherently formed on the substrate.

2. The method of claim 1, further comprising minimizing an oxygen content around the substrate by flowing nitrogen gas into a deposition space around the substrate.

3. The method of claim 1, wherein the substrate comprises a member from the group consisting of glass, treated glass, plastic, polymeric films, ceramics, metal foils, or combinations thereof.

4. The method of claim 3, wherein the substrate comprises the treated glass and the treated glass is treated with a molybdenum coating.

5. The method of claim 1, further comprising removing organic residues from the substrate prior to applying the cadmium precursor solution and prior to applying the telluride precursor solution.

6. The method of claim 1, wherein the applying of the cadmium precursor solution, the telluride precursor solution, or a combination thereof occurs to form uniform thin films having a film thickness ranging from 10 nm to 500 nm.

7. The method of claim 6, wherein the applying of the cadmium precursor solution, the telluride precursor solution, or a combination thereof occurs by spray coating, roll to roll type deposition, or spin coating.

8. The method of claim 1, wherein the cadmium precursor solution or the telluride precursor solution is heated during deposition to reduce a solvent content and to facilitate formation of the CdTe film.

9. The method of claim 1, further comprising drying the precursor film prior to applying the other of the cadmium precursor solution or the telluride precursor solution.

10. The method of claim 1, wherein the cadmium precursor solution comprises cadmium chloride, cadmium nitrate, cadmium phosphate, cadmium phosphide, cadmium sulfate, cadmium sulfide, or a combination thereof.

11. The method of claim 1, wherein the telluride precursor solution further comprises a reducing agent.

12. The method of claim 11, wherein the reducing agent comprises sodium hydroxymethylsulfinate, sodium hydroxide, water, an oxygen free reducing agent, a sulfur free reducing agent, a sodium free reducing agent or a combination thereof.

13. The method of claim 1, wherein the telluride precursor solution includes sulfur in sufficient content to form a cadmium telluride sulfur alloy as the CdTe film.

14. The method of claim 1, wherein the cadmium precursor solution includes selenium in sufficient content to form a cadmium telluride selenium alloy as the CdTe film.

15. The method of claim 1, wherein a solvent used to create the cadmium precursor solution, the telluride precursor solution, or a combination thereof comprises a member selected from the group consisting of water, methanol, acetonitrile, sodium hydroxymethylsulfonate, sodium hydroxide, oxygen free solvent, or a combination thereof.

16. The method of claim 1, further comprising repeating the steps of applying the cadmium precursor solution and applying the telluride precursor solution to the substrate on the CdTe film sufficient to reach a predetermined thickness of the CdTe film.

17. The method of claim 16, further comprising applying a high-shear wash step after each step of applying the cadmium precursor solution or the telluride precursor solution.

18. The method of claim 16, wherein each repetition of the steps of applying the cadmium precursor solution and applying the telluride precursor solution results in an added thickness to the CdTe film from 10 nm to 1 μm.

19. The method of claim 1, further comprising applying a post-deposition annealing step in a reducing environment.

20. The method of claim 1, wherein the method does not involve electrodeposition.

21. The method of claim 1, wherein the cadmium telluride film has grain sizes ranging from about 50 nm to 150 nm on average.

* * * * *